United States Patent
Jang et al.

(10) Patent No.: US 10,038,140 B2
(45) Date of Patent: Jul. 31, 2018

(54) RERAM USING STACK OF IRON OXIDE AND GRAPHENE OXIDE FILMS

(71) Applicant: GWANGJU INSTITUTE OF SCIENCE AND TECHNOLOGY, Gwangju (KR)

(72) Inventors: Jae Hyung Jang, Gwangju (KR); Rani Anoop, Gwangju (KR); Se I Oh, Gwangju (KR)

(73) Assignee: Gwangju Institute of Science and Technology, Gwangju (KR)

(*) Notice: Subject to any disclaimer, the term of this patent is extended or adjusted under 35 U.S.C. 154(b) by 0 days.

(21) Appl. No.: 15/625,673

(22) Filed: Jun. 16, 2017

(65) Prior Publication Data

US 2017/0365781 A1    Dec. 21, 2017

(30) Foreign Application Priority Data

Jun. 16, 2016    (KR) .................. 10-2016-0074866

(51) Int. Cl.
*H01L 45/00*    (2006.01)
*H01L 29/68*    (2006.01)
(Continued)

(52) U.S. Cl.
CPC ........ *H01L 45/147* (2013.01); *G11C 13/0007* (2013.01); *G11C 13/0097* (2013.01);
(Continued)

(58) Field of Classification Search
CPC ............... H01L 45/085; H01L 45/1233; H01L 45/1253; H01L 45/1608; H01L 45/147
See application file for complete search history.

(56) References Cited

U.S. PATENT DOCUMENTS

| | | | | |
|---|---|---|---|---|
| 7,781,230 B2* | 8/2010 | Odagawa | ........... | G11C 13/0007 257/E21.663 |
| 8,778,701 B2* | 7/2014 | Odagawa | ................ | H01F 41/30 438/3 |

(Continued)

FOREIGN PATENT DOCUMENTS

| EP | 2345071 B1 | 5/2013 |
|---|---|---|
| JP | 2008166591 A | 7/2008 |

(Continued)

OTHER PUBLICATIONS

Lin et al, "Room Temperature Magnetic Graphene Oxide-Iron Oxide Nanocomposite Based Magnetoresistive Random Access Memory Devices via Spin Dependent Trapping of Electrons", Feb. 28, 2014, www.small-journal.com, 10, No. 10, 1945-1952.*

(Continued)

*Primary Examiner* — Christine Enad
(74) *Attorney, Agent, or Firm* — Loza & Loza, LLP; Heidi Eisenhut

(57) ABSTRACT

There is provided a non-volatile memory device comprising: a substrate; a lower electrode disposed on the substrate; a resistance layer disposed on the lower electrode; and an upper electrode disposed on the resistance layer, wherein the resistance layer include a stack of a graphene oxide film and an iron oxide film, wherein a resistance value of the resistance layer varies based on a voltage applied to the upper electrode.

7 Claims, 6 Drawing Sheets

(51) Int. Cl.
*G11C 13/00* (2006.01)
*H01L 27/24* (2006.01)
*H01L 29/786* (2006.01)

(52) U.S. Cl.
CPC ........ *H01L 27/2436* (2013.01); *H01L 29/685* (2013.01); *H01L 45/08* (2013.01); *H01L 45/085* (2013.01); *H01L 45/1233* (2013.01); *H01L 45/1253* (2013.01); *H01L 45/146* (2013.01); *H01L 45/149* (2013.01); *H01L 45/1608* (2013.01); *H01L 29/7869* (2013.01)

(56) References Cited

U.S. PATENT DOCUMENTS

| | | |
|---|---|---|
| 2011/0170330 A1 | 7/2011 | Dezyilmaz et al. |
| 2012/0005606 A1 | 8/2012 | Lee et al. |
| 2012/0205606 A1* | 8/2012 | Lee .......................... H01L 45/04 257/2 |

FOREIGN PATENT DOCUMENTS

| | | |
|---|---|---|
| KR | 100824294 B1 | 4/2008 |
| KR | 101157105 B1 | 6/2012 |

OTHER PUBLICATIONS

Janardhanan R. Rani, Se-I. Oh, Jeong Min Woo, Jae-Hyung Jang; Low voltage resistive memory devices based on graphene oxide-iron oxide hybrid; Carbon; Jul. 3, 2015; pp. 362-368; Issue 94; Elsevier B.V.; https://www.journals.elsevier.com/carbon.

Cava, Memory Effects on Iron Oxide filled carbon nanotubes. Royal Institute of Technology licentiate thesis, 48 pp. (Nov. 2013).

Porro, "Memristive device based on graphene oxide." Carbon 85 (2015) 383-396, 8 pp. (Jan. 10, 2015).

* cited by examiner

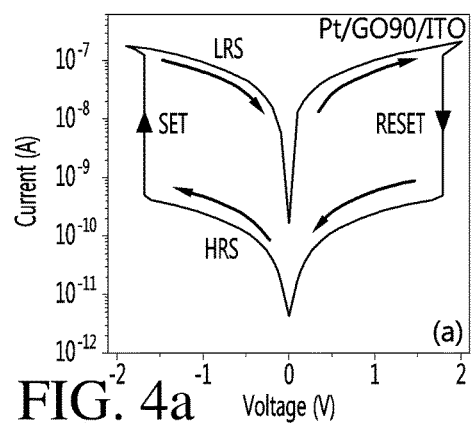
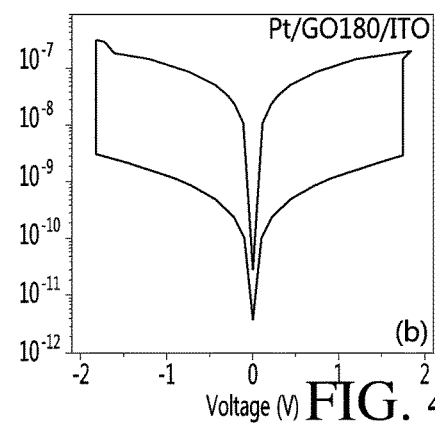
FIG. 4a
FIG. 4b
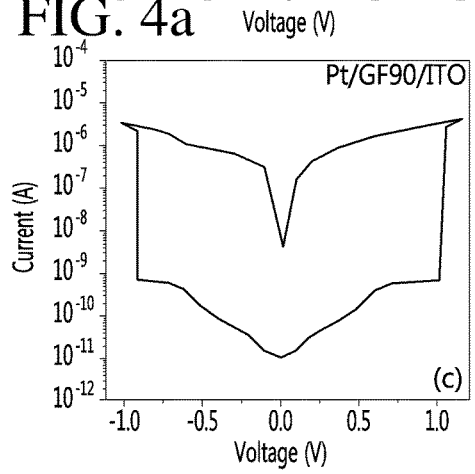
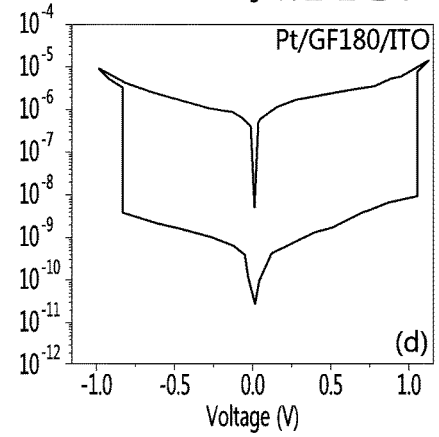
FIG. 4c
FIG. 4d

RERAM USING STACK OF IRON OXIDE AND GRAPHENE OXIDE FILMS

BACKGROUND

Field of the Present Disclosure

The present disclosure relates to a non-volatile memory device. More particularly, the present disclosure relates to a non-volatile memory device using a stack of iron oxide and graphene oxide films as a resistance layer thereof.

Discussion of Related Art

In general, as the size of the semiconductor memory device decreases, miniaturization techniques for increasing the degree of integration of the device have been regarded as the core of the memory technology in order to allow the memory device to have a higher storage capacity. Currently, in the semiconductor industry, "NAND Flash" is widely used as a non-volatile memory device. In the case of a NAND flash memory based on a transistor structure, it is difficult to reduce the size of the transistor element to 7 nm or less in the long term due to physical and technical limitations. Thus, for the NAND flash, there is a limit to integration based on miniaturization. In recent years, an approach capable of greatly increasing the storage capacity of the memory device per area by stacking the NAND flash devices, which is a conventional planar structure, in three dimensions has been proposed. This has opened up the possibility of increasing the memory capacity, which was not the case due to limitations of miniaturization. However, there are many problems and difficulties in developing the three-dimensional staked structure. In this context, researches on the next generation memory to overcome the limitations of the NAND flash memory are actively proceeding. A resistive random access memory (ReRAM) with high density, high integration, and low-power is attracting attention as a next-generation memory device following the NAND flash. The ReRAM utilizes a simple device structure metal layer/resistance layer/metal layer and features the ability to record information based on changes in the resistance state resulting from increasing or decreasing the electrical resistance via appropriate electrical signals applied thereto. Such ReRAM is advantageously applied to a three-dimensional stacked structure due to the advantageous stacking process resulting from the simple structure thereof as described above.

As the resistance layer of the ReRAM device, a variety of materials such as two-elemental metal oxides (NiO, $TiO_2$, ZnO, $HfO_2$), solid electrolytes (GeSe, $Ag_2S$) and perovskite oxides ($SrZrO_3$), etc. are used. Among them, the graphene oxide (GO) is being studied as a resistive layer. This is because the graphene oxide has various advantages such as chemical functionalization or hybrid complex formation, and allows a solution-based manufacturing process thereof advantageous in terms of large area production and process cost. ReRAM devices fabricated using the graphene oxide as the resistance layer thereof are disclosed in US Patent Application Publication No. US 2012/0080656A1 and US Patent Application Publication No. 2012/0205606A1. However, the graphene oxide-based ReRAM device has a relatively large number of defects between the electrode and the oxidized graphene and has a large interfacial resistance between them. Also, due to the Pauli repulsive interaction, a very weak chemical bond is formed between the electrode made of Pt, Ag, Al, Cu, or Au and the carbon of the oxidized graphene. This problem also attenuates the interface characteristics of the memory device. Thus, the memory devices have poor characteristics, such as a low current at a low resistance-state, a high operating threshold voltage, and low endurance.

Accordingly, in order to overcome the above-mentioned problems, employment of a hybrid composite material prepared by combining the graphene oxide and a different material as the resistance layer so as to realize excellent interface characteristics between the electrode and the graphene oxide is sought.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

According to the present disclosure, in order to overcome the poor electrical characteristics such as the low current at a low resistance-state and the high operating threshold voltage when only the graphene oxide is employed as the resistance layer as in the prior art, the resistance layer of the non-volatile resistive switching memory device is made of a hybrid material that allows high efficiency and excellent reproducibility in the resistance change of the memory device.

In one aspect of the present disclosure, there is provided a non-volatile resistive switching memory device comprising: a substrate; a lower electrode disposed on the substrate; a resistance layer disposed on the lower electrode; and an upper electrode disposed on the resistance layer, wherein the resistance layer include a stack of a graphene oxide film and an iron oxide film, wherein a resistance value of the resistance layer varies based on a voltage applied to the upper electrode.

In one implementation of the device, the stack is configured that the graphene oxide film contacts the lower electrode and the iron oxide film contacts the upper electrode, wherein the iron oxide film includes iron-oxide nano-particles.

In one implementation of the device, the stack is formed by spin-coating a solution containing iron-oxides and graphene oxides on the lower electrode and annealing the solution.

In one implementation of the device, when a negative voltage with a predetermined level is applied to the upper electrode, the iron oxide film is changed via reduction of the iron oxide to a state in which conductive $Fe_3O_4$ ions are rich therein, and, thus, conductive filaments are formed therein.

In one implementation of the device, when a positive voltage with a predetermined level is applied to the upper electrode, the iron oxide film is changed via oxidation of the iron oxide to a state in which non-conductive $\gamma\text{-}Fe_2O_3$ ions are rich therein, and, thus, conductive filaments are ruptured therein.

In another aspect of the present disclosure, there is provided a method for manufacturing a non-volatile resistive switching memory device, the method comprising: providing a substrate: forming a lower electrode on the substrate; forming a stack of a graphene oxide film and an iron oxide film on the lower electrode using a solution process, wherein the stack acts as a resistance layer for the device; and forming an upper electrode on the stack, wherein a resistance value of the resistance layer varies based on a polarity and magnitude of voltages applied to the upper electrode.

In one implementation of the method, the solution process comprises: providing a solution containing graphene oxides and iron oxides; spin-coating the solution on the lower electrode; and annealing the solution spin-coated on the lower electrode.

In one implementation of the method, when a negative voltage with a predetermined level is applied to the upper electrode, the iron oxide film is changed via reduction of the iron oxide to a state in which conductive $Fe_3O_4$ ions are rich therein, and, thus, conductive filaments are formed therein.

In one implementation of the method, a positive voltage with a predetermined level is applied to the upper electrode, the iron oxide film is changed via oxidation of the iron oxide to a state in which non-conductive $\gamma$-$Fe_2O_3$ ions are rich therein, and, thus, conductive filaments are collapsed therein.

In the resistive switching memory device in accordance with the present disclosure, the memory operation is realized at a lower switching voltage compared to the graphene oxide based memory device according to the prior art. Further, the resistive switching memory device in accordance with the present disclosure possess an improved On/Off state current ratio compared to the graphene oxide based memory device according to the prior art.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIGS. 4a, 4b, 4c and 4d show graphs showing current-voltage characteristics of resistive switching memory devices according to the prior art and the present disclosure, respectively.

DETAILED DESCRIPTION

Figure 1:
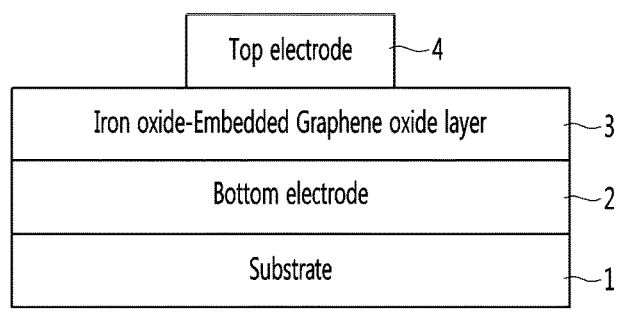
FIG. 1 is a diagrammatic representation of a resistive switching memory device according to the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

According to the present disclosure, in order to overcome the poor electrical characteristics, such as the low current at a low resistance-state and the high operating threshold voltage, when the graphene oxide is employed as the resistance layer, the resistance layer of the non-volatile memory device is made of a hybrid material that allows high efficiency and excellent reproducibility in the resistance change of the memory device.

FIG. 1 is a diagrammatic representation of a resistive switching memory device according to the present disclosure.

Referring to FIG. 1, the resistive switching memory device 10 according to an embodiment of the present disclosure includes a lower electrode 2 disposed on a substrate 1, a resistance layer 3 disposed on the lower electrode 2 and made of a hybrid material, and an upper electrode 4 disposed on the resistance layer 3.

In this embodiment, the resistance layer 3 is implemented as a stack of an iron oxide thin film 3b and a graphene oxide thin film 3a. In this embodiment, in order to overcome the poor electrical characteristics, such as low current at a low resistance-state and the high operating threshold voltage, when the graphene oxide is employed as the resistance layer as in the prior art, a hybrid material comprising of the iron oxide film and the graphene oxide film is used as the resistance layer to improve the interfacial properties between the upper electrode 4 and the graphene oxide of the memory device. The hybrid stack between the upper electrode and the lower electrode may be formed through a solution process. The stack may be formed of the iron oxide nanoparticles embedded in the graphene oxide thin film.

In the nonvolatile resistive switching memory device according to the present embodiment, the thickness of the graphene oxide thin film may be 4 to 6 nm, and the thickness of the iron oxide thin film may be 10 to 15 nm, and the thickness of the resistance layer made of the stack is preferably 21 nm or less. However, the present disclosure is not limited thereto. These thicknesses may vary depending on the electrical characteristics of the memory device.

Figure 2:
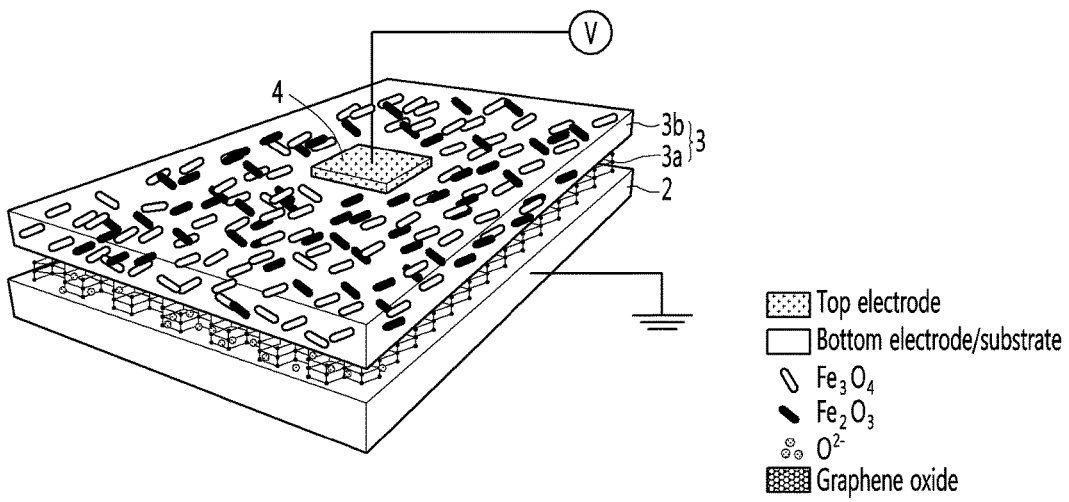
FIG. 2 is a perspective view of a resistive switching memory device according to the present disclosure.

FIG. 2 is a perspective view of a resistive switching memory device according to the present disclosure.

Prior to describing FIG. 2, the memory device including the stack of the iron oxide thin film and the graphene oxide thin film according to the present embodiment, and a method of producing the same will be briefly described.

First, the graphene oxide may be obtained from natural graphite powders by various methods that have been disclosed previously. The graphene oxide thus obtained is put into a solution of water and $FeCl_3$ to form a mixture. The mixture is sonicated for 30 minutes through an ultrasonic reactor driven at a predetermined frequency. Thereafter, the mixture is subjected to centrifugation treatment at 10,000 rpm for a predetermined time. Thereby, a homogeneous suspension is obtained.

Subsequently, by extracting the upper portion of the suspension, a solution containing the iron oxide and the graphene oxide is obtained. In this regard, the nanoparticles of the iron oxide are chemically reacted via a constant state change mechanism. Specifically, via subsequent annealing of FeOOH, interconversion between $\gamma$-$Fe_2O_3$ and $Fe_3O_4$ may occur.

The solution is further sonicated. The solution containing graphene oxide and iron oxide may be used to produce the present resistive switching memory device. For the manufacture of the resistive switching memory device, a substrate with the lower electrode is prepared, and then the thus-resulting solution is spin-coated on the lower electrode. Thereafter, for a predetermined time, the solution is subjected to an annealing process.

Referring to FIG. 2, the resistive switching memory device according to the present embodiment includes the substrate 1 and the lower electrode 2 made of, for example, indium-tin-oxide ITO on the substrate. Then, the thus-resulting solution is spin-coated on the lower electrode, and, thereafter, for a predetermined time, the solution is subjected to an annealing process. In this way, the stack of the graphene oxide thin film 3a and the iron oxide thin film 3b may be formed on the lower electrode 2 with a predetermined thickness. Then, the upper electrode 4 made of platinum Pt having a thickness of 150 nm may be deposited on the stack 3 of the graphene oxide and the iron oxide thin films by electron beam evaporation.

When the graphene oxide and iron oxide-containing solution is dispersed on the lower electrode 2, due to the difference in density, the graphene oxide is formed as a thin film on the lower electrode, and the iron oxide is formed as another thin film in a form of nanoparticles on the graphene oxide thin film. The stack of the graphene oxide and iron oxide thin films may have different characteristics depending on the annealing temperature in the solution process.

Regarding the stack structure of the graphene oxide and iron oxide thin films, the graphene oxide is formed into a thin film having a constant thickness, and the iron oxide is laminated on the graphene oxide to a certain thickness. In the iron oxide thin film, $\gamma$-$Fe_2O_3$ and $Fe_3O_4$ particles are mixed in a predetermined ratio. Oxygen ions ($O^{2-}$) are randomly distributed in the graphene oxide thin film.

Figure 3A:
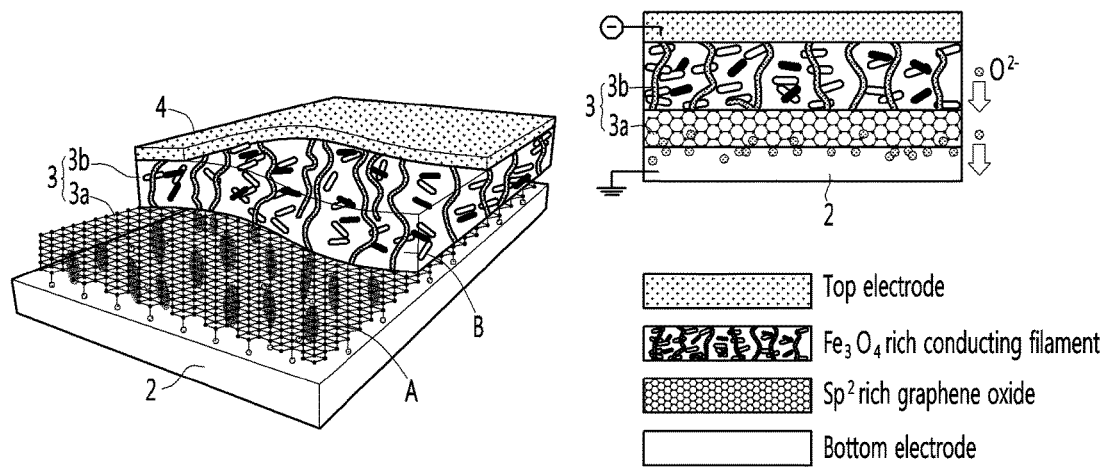
FIGS. 3a and 3b illustrate operation of a resistive switching memory device according to the present disclosure.
Figure 3B:
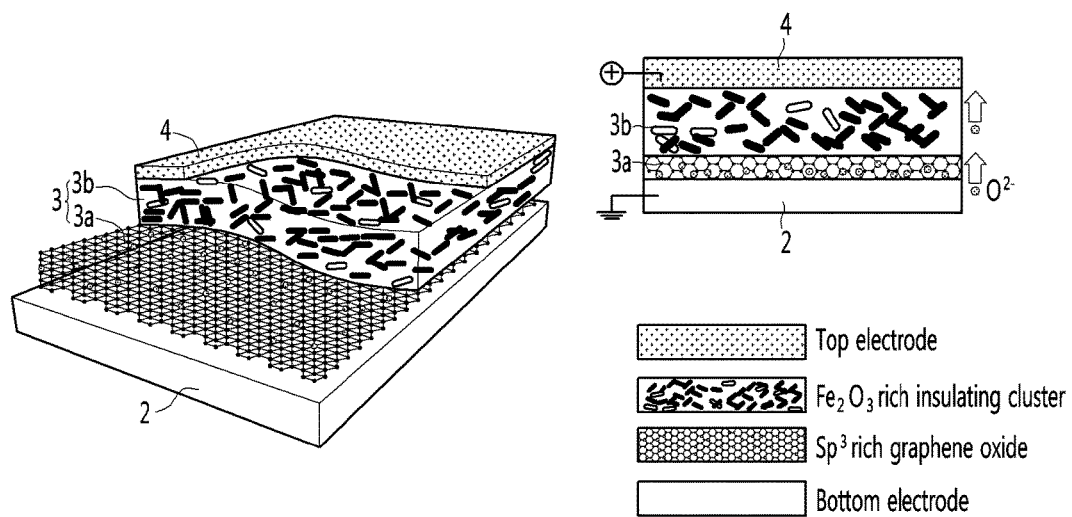

FIGS. 3a and 3b illustrate operation of the resistive switching memory device according to the present disclosure. FIG. 3a illustrates a set state in which a negative voltage is applied to the upper electrode. FIG. 3b shows a reset state in which a positive voltage is applied to the upper electrode.

The non-volatile memory device according to the present embodiment can be switched between the two resistance states, that is, a conductive state and a non-conductive state, depending on the polarity and magnitude of the voltage applied thereto. In the present embodiment, the set state in which a negative voltage with a certain level or less is applied thereto corresponds to a conductive state in which the resistance becomes decreased, whereas a reset state in which a positive voltage with a certain level or more is applied thereto corresponds to a non-conductive state in which the resistance becomes large.

In the resistive switching memory device based on the graphene oxide, such resistance switching may occur due to adsorption and desorption of oxygen ions present in the graphene oxide thin film. Detachment of oxygen ions in the graphene oxide thin film allows disordered regions within the hexagonal graphene lattices, which creates electron trap states capable of holding electrons. The switching of resistance is possible due to the formation of conduction paths consisted of the electron trap state.

When an electric field reaches a predetermined magnitude, the resistance of the memory device is switched from high resistance-state to low resistance-state, which is called as the SET process. When a negative voltage is applied to the upper electrode, the electric field pushes the oxygen ions present in the graphene oxide thin film toward the lower electrode, whereby oxygen vacancies are generated in the graphene oxide thin film. The oxygen vacancies in the graphene oxide cause the $sp^2$ hybridized carbon state to be dominant over the insulating $sp^3$ carbon-oxygen state, which leads to electron trap states acting as hopping paths in the graphene oxide. A conductive path is generated due to an increase in the concentration of electron charges in the graphene oxide film. Thus, the graphene oxide film has a high conductivity. In this way, a plurality of conductive paths may be formed in the graphene oxide film as shown in FIG. 3a.

At the same time, when the negative voltage is applied to the upper electrode, oxygen ions in the iron oxide film are pushed toward the lower electrode. The insulating $\gamma$-$Fe_2O_3$ is transformed into a conducting $Fe_3O_4$ phase by the redox reaction induced by the oxygen movement. Thus, the conducting $Fe_3O_4$ phase becomes richer in the iron oxide film. The replenishing of the $Fe_3O_4$ in the iron oxide film can easily form highly conducting filamentary paths, such as B as shown in FIG. 3a, in the iron oxide film.

Thus, when the negative voltage is applied to the upper electrode, the conductive paths may be formed through the entire iron oxide thin film and graphene oxide thin film.

The resistance change reaction in the iron oxide film as described above is caused by the oxidation and reduction reaction between $Fe_3O_4$ and $\gamma\text{-}Fe_2O_3$. The reaction formula is as follows:

$$2Fe_3O_4 + O^{2-} \longleftrightarrow 3\gamma\text{-}Fe_2O_3 + 2e^-$$

The graphene oxide and iron oxide thin films may be changed to a conductive state in which $Fe_3O_4$ is rich, or an insulating state in which $\gamma\text{-}Fe_2O_3$ is rich.

As described above, the oxidation and reduction reaction occurring inside the iron oxide film is caused by the movement of oxygen ions, which may change the electrical characteristics of the memory device so that the memory device becomes conductive or insulating.

Referring again to FIG. 3a, another conductive path may be formed in the interfacial layer between the graphene oxide thin film and the iron oxide thin film. In the graphene oxide thin film, $\pi$ orbitals of C—C bonds are more localized and interact with Fe, resulting in the interaction between d and $\pi$ orbitals. Functional ions containing oxygen are suitable for the reaction with Fe ions, which leads to a large-scale coupling between Fe—C—O. This forms a charge transfer channel between C2p and Fe3d states, leading to the formation of conductive filaments in the interfacial layer.

The resistive switching memory can be switched to the ON state forming the filament-type conductive paths in the graphene oxide thin film. Due to the additional current paths formed in the iron oxide and the interfacial layer between the iron oxide thin film and graphene oxide thin film, respectively, as described above, the memory device using the stack of the graphene oxide thin film and the iron oxide thin film as the resistance layer can have a high ON-current and a low resistance in the ON-state, as in the present embodiment.

When a positive voltage is applied to the upper electrode, the oxygen ions move from the lower electrode to the graphene oxide film and to the iron oxide film where $Fe_3O_4$ is rich. At this time, the iron oxide layer becomes a state in which the non-conductive $\gamma\text{-}Fe_2O_3$ is rich, and, thus, the conductive channel is disconnected therein. At the same time, the oxygen ions attach to the graphene oxide, and, thus, the graphene oxide film is formed of combinations of two-dimensional hexagonal structures with a $sp^3$ rich state. Therefore, the conductive channels formed in the interfacial layer and the graphene oxide layer are partially disconnected, and, thus, the resistance is rapidly increased. That is, the conductive filaments formed in the ON state as shown in FIG. 3a are disconnected, and, thus, the memory device is switched to OFF state.

By the oxidation and reduction between $Fe_3O_4$ and $\gamma\text{-}Fe_2O_3$ phases in the iron oxide thin film, such resistance switching between the above two states may be repeated at the interface between the upper electrode and the graphene oxide thin film. The current value in the low resistance-state may be determined by the number, size, and conductivity of the conductive filaments.

FIGS. 4a, 4b, 4c and 4d shows graphs showing current-voltage characteristics of resistive switching memory devices according to the prior art and the present disclosure, respectively. Those graphs show bipolar resistance switching characteristics of the memory devices.

FIG. 4a and FIG. 4b show switching characteristics when only a graphene layer is used as a resistance layer according to the prior art. In particular, FIG. 4a shows the current and voltage characteristics in a memory device (GO90) fabricated by annealing the graphene oxide at a temperature of 90 degrees according to the prior art. FIG. 4b shows current and voltage characteristics in a memory device (GO180) fabricated by annealing the graphene oxide at 180 degrees according to the prior art.

When a negative voltage is applied to the upper electrode, the memory device reaches the SET voltage, and the current suddenly increases. This change in the amount of current means that the resistance is changed from the high resistance-state to the low resistance-state. The voltage and current characteristics in the low resistance-state are defined as characteristics of the SET state or the ON state.

On the contrary, when the applied positive voltage is gradually increased, the current suddenly decreases. The voltage at this time is called the RESET voltage, and the memory device is switched from the low resistance-state to the high resistance-state. The current and voltage characteristics in the high resistance-state are defined as the RESET state or the OFF state characteristic.

FIG. 4c and FIG. 4d show switching characteristics when a stack of the graphene oxide and iron oxide thin films is used as a resistance layer according to the present disclosure. In particular, FIG. 4c shows the current and voltage characteristics in a memory device (GF90) fabricated by annealing the stack at a temperature of 90 degrees. FIG. 4d shows current and voltage characteristics in a memory device (GF180) fabricated by annealing the stack at 180 degrees. The SET and RESET voltages in FIG. 4c an FIG. 4d are lower than the SET and RESET voltages in FIG. 4a an FIG. 4.

According to the present embodiment, the platinum used as the upper electrode has a high adhesion energy with the iron oxide, and, thus, a strong interaction is generated between the upper metal electrode and the stack. Due to the interaction between d orbital of the iron (Fe) and $\pi$ orbital of the carbon (C), there are strong Fe—C atomic bonds between the iron oxide and the graphene oxide. As a result, since the Pt—O—Fe bond and the Fe—C bond are strongly formed, the interface characteristics of the memory device can be improved.

As described above, since the Pt—O—Fe bond is strong at the interface between the upper metal electrode and the stack of the iron oxide and the graphene oxide films, its interface resistance is lower than that between the upper metal electrode and the graphene oxide thin film.

Furthermore, it is shown that ratios between the SET or ON state current and the RESET or OFF state current shown in FIG. 4c an FIG. 4d are higher than ratios between the SET or ON state current and the RESET or OFF state current shown in FIG. 4a an FIG. 4b. This is mainly because the interface resistance is more decreased in a memory device using the stack of the iron oxide and the graphene films.

Moreover, in accordance with the prior art, when the resistance layer is annealed at 180 degrees, the OFF current of the memory device increases. It may be shown that the on/off current ratio in this case is smaller than that in the case where the resistance layer is annealed at 90 degrees. This is attributed to the smaller concentration of oxygen groups in the resistance layer when annealed at 180 degrees than that when annealed at 90 degrees.

Figure 5A:
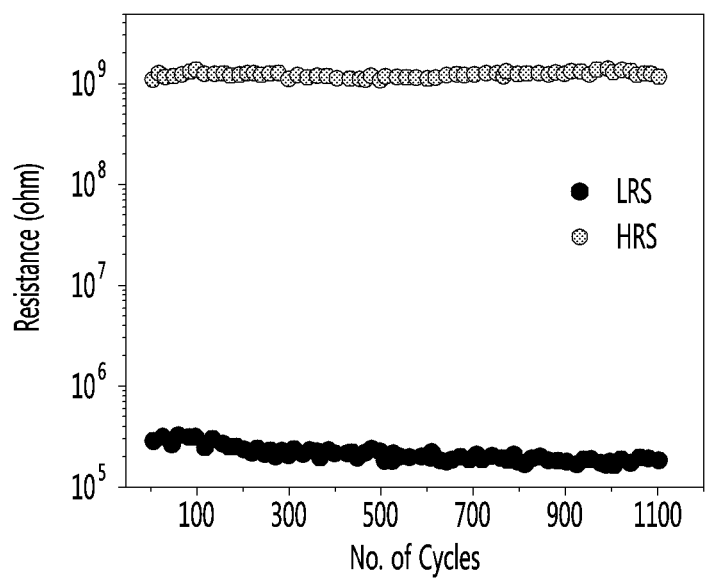
FIGS. 5a and 5b show graphs showing endurance and retention characteristics for a resistive switching memory device according to the present disclosure.
Figure 5B:
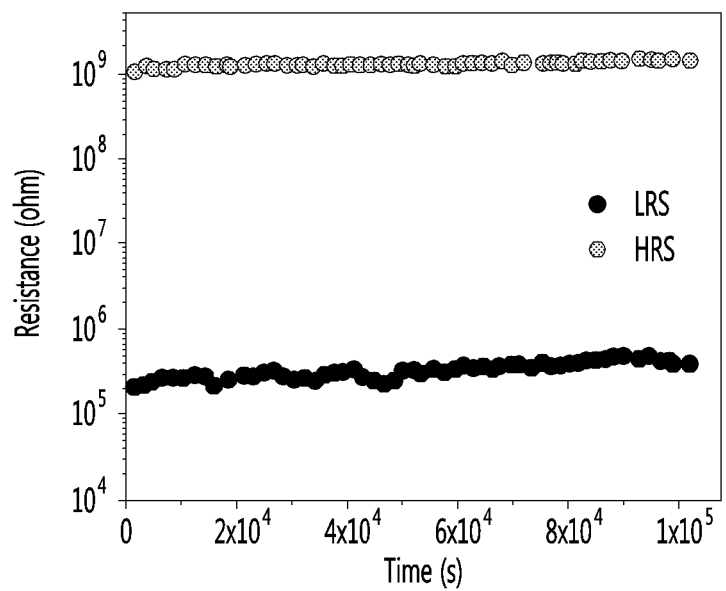

FIG. 5a is a graph showing the endurance characteristics of the resistive switching memory device according to the present disclosure. FIG. 5b is a graph showing the retention characteristics of the resistive switching memory device according to the present disclosure.

In the memory device according to one embodiment, the resistance value in the high resistance-state was about $10^9 \Omega$, and the resistance value in the low resistance-state was about $10^5 \Omega$. Although the resistance values may show slight variations, the memory device according to the present embodiment does not exhibit a remarkable difference between the resistance values even during the operation for 1100 cycles as shown in FIG. 5a. Likewise, as shown in FIG. 5b, it can be shown that no significant difference between the resistance values is exhibited during the operation for $10^5$ secs for the memory device.

Through these experiments, the switching between the ON and OFF states in the memory device according to the present embodiment is reversible and reproducible.

That is, the non-volatile memory device according to the present disclosure employs the stack of the iron oxide and graphene oxide thin films as the resistance layer so that when the SET voltage or the RESET voltage is applied to the upper electrode to switch the resistance state, the stable resistance values are maintained.

Figure 6:
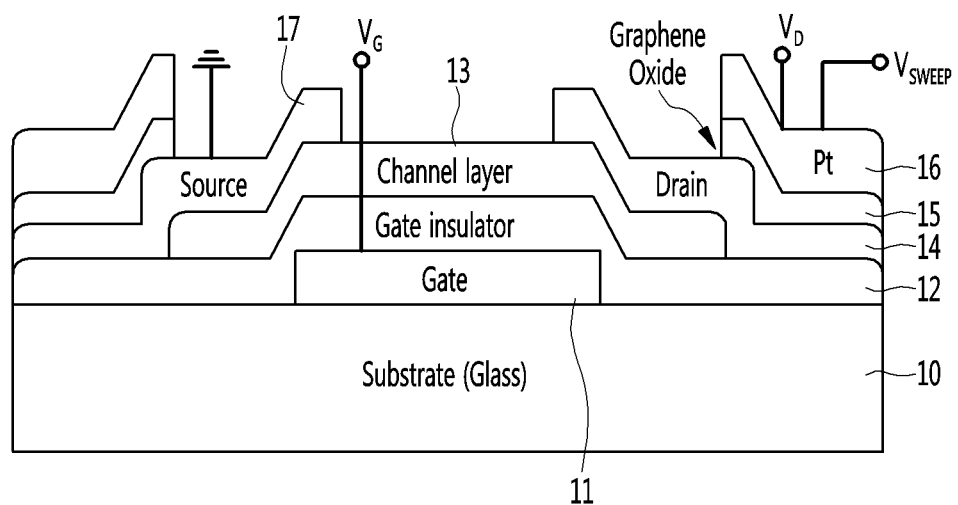
FIG. 6 is a diagram illustrating a 1T-1R type memory device implemented by coupling a resistive switching memory device according to the present disclosure to a thin-film transistor.

FIG. 6 is a cross-sectional diagram illustrating a 1T-1R type resistive memory device implemented by coupling a resistive switching memory device according to the present disclosure to a thin-film transistor. More specifically, FIG. 6 is a cross-sectional diagram illustrating a 1T-1R type resistive memory device implemented by coupling a resistive switching memory device according to the present disclosure to an oxide semiconductor-based thin-film transistor to drain side thereof.

Referring to FIG. 6, a 1T-1R type resistive memory device includes a substrate 10 and a gate electrode 11 made of ITO on the substrate. On the gate electrode 11, an insulating layer 12 made of a silicon nitride film is formed. On the insulating layer 12, a channel layer 13 made of an IGZO material and forming a channel layer of the transistor is formed. There are formed a source 17 covering a left portion of the channel layer 13, and a drain 14 covering a right portion of the channel layer 13, respectively.

A stack 15 of the graphene oxide and iron oxide thin films according to the embodiment partially covers the top surface of the drain. That is, the stack 15 of the graphene oxide and iron oxide thin films may serve as the resistance layer of the present memory device. The upper electrode 16 is partially formed on the stack 15 of the graphene oxide and iron oxide thin films.

Figure 7:
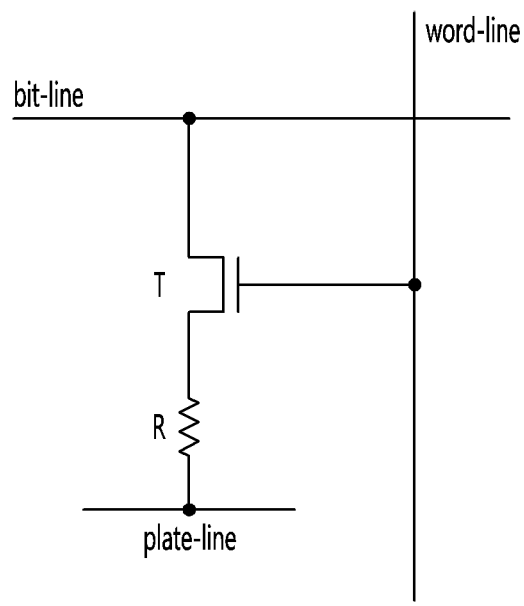
FIG. 7 is an equivalent circuit diagram of a 1-bit cell 1T-1R type resistive switching memory device shown in FIG. 6

FIG. 7 is an equivalent circuit diagram of a 1-bit cell 1T-1R type resistive memory device shown in FIG. 6 Referring to FIG. 7, in the 1T-1R type resistive memory device, drain electrode includes a MIM structure for the resistance switching. The memory device includes one word line and one bit line, and one bit line includes one transistor and one resistive device. Thus, this device may be referred to as a 1T-1R type resistive memory device.

When a certain level of a positive voltage is applied to the upper electrode, the graphene oxide comes into an insulating state, thereby regulating the drain current in the 1T-1R memory device. Assuming that the pulse amplitudes in the ON and OFF states are −4V and +4V, respectively, when the IGZO thin-film transistor is turned on, the current flowing from the drain to the source varies depending on the two states of the graphene oxide based resistive memory device.

A positive voltage is applied to the gate electrode to switch the IGZO thin-film transistor from an off state to an on state. The operation of the 1T-1R memory device may be defined by the characteristics between the drain current and the drain voltage or by the characteristics between the drain current and the gate voltage. When the graphene oxide-based memory device is in a low resistance-state, the curve characteristic between the drain current and the drain voltage of the 1T-1R memory device may appear similar to that of a single IGZO thin-film transistor. However, the current level of the 1T-1R memory device in saturation is somewhat reduced compared to the current level of a single transistor.

On the other hand, when the graphene oxide-based memory device becomes a high resistance-state, current flow from the drain to the source is significantly reduced due to the high resistance of the resistive memory device. This is because the effective drain bias is significantly lowered due to the voltage drop in the memory resistance layer region integrated in the drain region.

An improved drain current density of the 1T-1R memory device in a saturated state in accordance with the present disclosure may be obtained as compared to a 1T-1R memory device with the graphene oxide-based memory device in a low resistance-state. The 1T-1R device may take three states, the write state, the read state and the erase state, via the difference in the drain current values.

Thus, as described above, the graphene oxide may be applied to the non-volatile memory device serving as a resistance layer. According to an embodiment, when the stack of the graphene oxide thin film and the iron oxide thin film forms the resistance layer, the resistance of the interface between the upper electrode and the graphene oxide thin film may be lowered, and the conductive properties in the ON state may be improved. As a result, the electrical characteristics of the 1T-1R type resistive memory device can be improved.

Such a 1T-1R memory device may be easily applied as a non-volatile memory device to a next generation transparent flexible display such as a head-up display for a car, a smart window, etc.

Figure 8:
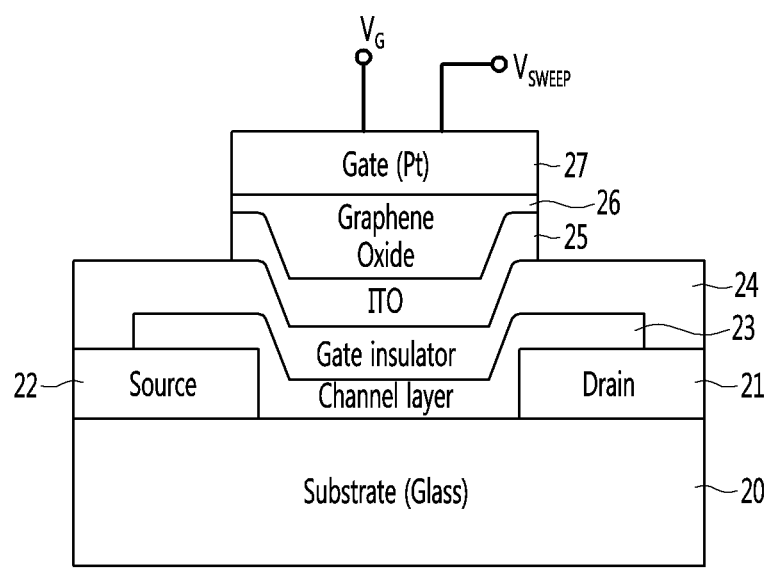
FIG. 8 is a cross-sectional view showing another example of a 1T-1R type resistive switching memory device.

FIG. 8 is a cross-sectional view showing another example of a 1T-1R type resistive memory device.

Referring to FIG. 8, a source 22 is formed on an upper left surface of a substrate 20, and a drain 21 is formed on an upper right surface of the substrate 20. Then, the channel layer 23 is formed to cover the exposed area of the substrate and portions of the source and the drain.

Then, a gate insulating layer 24 is formed to cover the channel layer 23 and the exposed portions of the source and drain. On the gate insulating layer 24, a memory device according to the present embodiment may be formed. That is, a stack in which the lower electrode 25, the resistance layer 26, and the upper electrode 27 are vertically stacked in this order may be provided on the gate insulating layer 24. The resistance layer 26 may comprise a stack of the graphene oxide film and the iron oxide film as described above.

The 1T-1R type resistive memory device shown in FIG. 8 also possess the improved current and voltage characteristics based on the enhanced resistance switching by using the stack of the oxide graphene thin film and the iron oxide thin film as the resistance layer.

As described above, the resistive switching memory device according to the embodiment may include the iron oxide film as an interfacial layer between the upper electrode and the graphene oxide film. Accordingly, the resistive switching memory device according to the present disclosure has a memory operation enabling at a lower switching voltage as compared with the graphene oxide-based memory device according to the prior art. Moreover, the resistive switching memory device according to the present disclosure has a more excellent on/off current ratio as compared with the graphene oxide based memory device according to the prior art.

According to the prior art, when only the graphene oxide is employed as the resistance layer, the memory device has the poor electrical characteristics, such as the low current at a low resistance-state and the high operating threshold voltage. However, according to the present disclosure, the resistance layer of the non-volatile memory device using the stack of the oxide graphene thin film and the iron oxide thin film allows high efficiency and excellent reproducibility in the resistance change of the memory device. For this reason, the present disclosure is considered to have highly industrial applicability in the field of the non-volatile memory device.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A non-volatile memory device comprising:
    a substrate;
    a lower electrode disposed on the substrate;
    a resistance layer disposed on the lower electrode; and
    an upper electrode disposed on the resistance layer,
    wherein the resistance layer include a stack of a graphene oxide film and an iron oxide film, the stack being configured such that the graphene oxide film contacts the lower electrode, and the iron oxide film contacts the upper electrode, the iron oxide film including iron-oxide nanoparticles,
    and wherein a resistance value of the resistance layer varies based on a voltage applied to the upper electrode,
    and wherein when a negative voltage with a predetermined level is applied to the upper electrode, the iron oxide film is changed via oxidation of the iron oxide to a state in which conductive Fe3O4 ions are rich therein, and, thus, conductive filaments are formed therein.

2. The device of claim 1, wherein the stack is formed by spin-coating a solution containing iron-oxides and graphene oxides on the lower electrode and annealing the solution.

3. The device of claim 1, wherein when a positive voltage with a predetermined level is applied to the upper electrode, the iron oxide film is changed via oxidation of the iron oxide to a state in which non-conductive $\gamma\text{-}Fe_2O_3$ ions are rich therein, and, thus, conductive filaments are removed therein.

4. A method for manufacturing a non-volatile resistive switching memory device, the method comprising:
    providing a substrate:
    forming a lower electrode on the substrate;
    forming a stack of a graphene oxide film and an iron oxide film on the lower electrode using a solution process, wherein the stack acts as a resistance layer for the device; and
    forming an upper electrode on the stack,
    wherein a resistance value of the resistance layer varies based on a voltage applied to the upper electrode,
    and wherein when a negative voltage with a predetermined level is applied to the upper electrode, the iron oxide film is changed via oxidation of the iron oxide to a state in which conductive Fe3O4 ions are rich therein, and, thus, conductive filaments are formed therein.

5. The method of claim 4, wherein the solution process comprises:
    providing a solution containing graphene oxides and iron oxides;
    spin-coating the solution on the lower electrode; and
    annealing the solution spin-coated on the lower electrode.

6. The method of claim 4, wherein when a positive voltage with a predetermined level is applied to the upper electrode, the iron oxide film is changed via oxidation of the iron oxide to a state in which non-conductive $\gamma\text{-}Fe_2O_3$ ions are rich therein, and, thus, conductive filaments are removed therein.

7. A non-volatile memory device comprising:
    a substrate;
    a lower electrode disposed on the substrate;
    a resistance layer disposed on the lower electrode; and
    an upper electrode disposed on the resistance layer,
    wherein the resistance layer include a stack of a graphene oxide film and an iron oxide film, the stack being configured such that the graphene oxide film contacts the lower electrode, and the iron oxide film contacts the upper electrode, the iron oxide film including iron-oxide nanoparticles,
    and wherein a resistance value of the resistance layer varies based on a voltage applied to the upper electrode,
    and wherein when a positive voltage with a predetermined level is applied to the upper electrode, the iron oxide film is changed via oxidation of the iron oxide to a state in which non-conductive $\gamma\text{-}Fe_2O_3$ ions are rich therein, and, thus, conductive filaments are removed therein.

* * * * *